United States Patent
Hatano et al.

(10) Patent No.: US 8,597,965 B2
(45) Date of Patent: Dec. 3, 2013

(54) LIGHT-EMITTING DEVICE AND ELECTRONIC DEVICE USING THE LIGHT-EMITTING DEVICE

(75) Inventors: Kaoru Hatano, Kanagawa (JP); Akihiro Chida, Kanagawa (JP); Akihisa Shimomura, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/467,166

(22) Filed: May 9, 2012

(65) Prior Publication Data

US 2012/0286312 A1    Nov. 15, 2012

(30) Foreign Application Priority Data

May 12, 2011    (JP) .................. 2011-107414

(51) Int. Cl.
*H01L 21/00* (2006.01)
*H01L 33/00* (2010.01)

(52) U.S. Cl.
USPC ............................................. 438/29; 257/98

(58) Field of Classification Search
USPC ............................................. 438/29; 257/98
See application file for complete search history.

(56) References Cited

U.S. PATENT DOCUMENTS

| | | | |
|---|---|---|---|
| 6,747,638 B2 | 6/2004 | Yamazaki et al. | |
| 7,180,091 B2 | 2/2007 | Yamazaki et al. | |
| 7,442,957 B2 | 10/2008 | Yamazaki et al. | |
| 7,525,523 B2 | 4/2009 | Yamazaki et al. | |
| 7,777,409 B2 | 8/2010 | Yamazaki et al. | |
| 2003/0032210 A1 | 2/2003 | Takayama et al. | |
| 2006/0132589 A1* | 6/2006 | Kang et al. | 347/225 |
| 2007/0281375 A1* | 12/2007 | Ibe et al. | 438/22 |
| 2008/0150419 A1* | 6/2008 | Kang | 313/504 |
| 2009/0061721 A1* | 3/2009 | Isa | 445/24 |
| 2009/0239320 A1 | 9/2009 | Takayama et al. | |
| 2009/0295769 A1 | 12/2009 | Yamazaki et al. | |

FOREIGN PATENT DOCUMENTS

| | | |
|---|---|---|
| EP | 0 858 110 A1 | 8/1998 |
| JP | 10-125931 | 5/1998 |
| JP | 2001-292276 | 10/2001 |
| JP | 2003-174153 | 6/2003 |

* cited by examiner

*Primary Examiner* — Thao Le
*Assistant Examiner* — Laura Dykes
(74) *Attorney, Agent, or Firm* — Nixon Peabody LLP; Jeffrey L. Costellia

(57) ABSTRACT

An object is to provide a method for manufacturing a light-emitting device including a flexible substrate, in which separation is performed without separation at the interface between the light-emitting layer and the electrode. A spacer formed of a light absorbing material which absorbs laser light is formed over a partition of one of substrates, a coloring layer is formed over the other substrate, and the substrates are bonded to each other with the use of a bonding layer. The light-emitting layer and the electrode which are formed over the spacer are irradiated with laser light through the coloring layer, so that at least the bonding layer among the light-emitting layer, the electrode, the coloring layer, and the bonding layer is melted to form a fixed portion where the bonding layer and the spacer are bonded by welding.

12 Claims, 9 Drawing Sheets

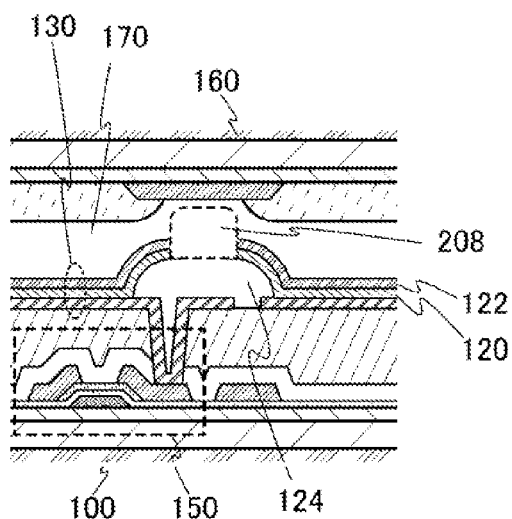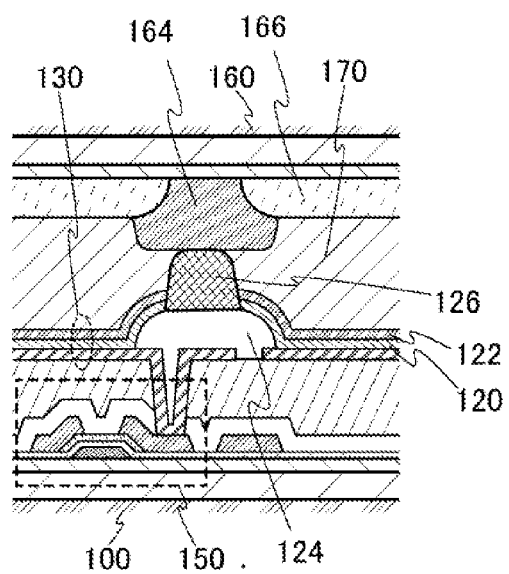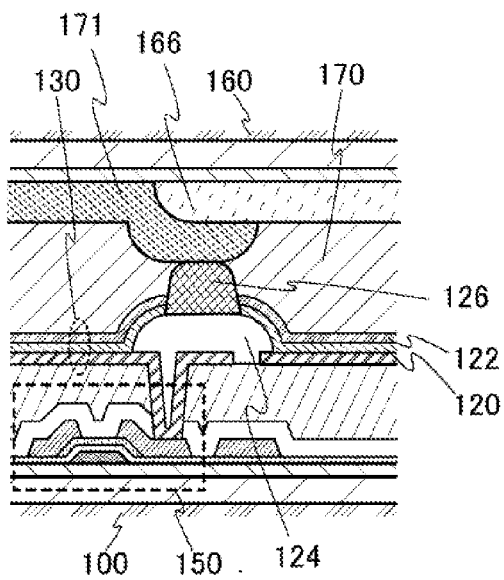

LIGHT-EMITTING DEVICE AND ELECTRONIC DEVICE USING THE LIGHT-EMITTING DEVICE

BACKGROUND OF THE INVENTION

1. Field of the Invention

One embodiment of the present invention relates to a light-emitting device utilizing electroluminescence. Further, an embodiment of the present invention relates to an electronic device using the light-emitting device.

2. Description of the Related Art

In recent years, research and development have been extensively conducted on light-emitting elements including electroluminescence (EL). In a basic structure of such a light-emitting element, a layer including a light-emitting substance is provided between a pair of electrodes. By voltage application to this element, light emission can be obtained from the light-emitting substance.

Since the above light-emitting element is a self-luminous type, a light-emitting device using this light-emitting element has advantages such as high visibility, no necessity of a backlight, low power consumption, and the like. Further, such a light-emitting element also has advantages in that the element can be formed to be thin and lightweight and that response time is high.

The light-emitting device having the light-emitting element can have flexibility and impact resistance in addition to its thinness and lightness and thus has been expected to be applied to a flexible substrate. The light-emitting element is applied not only to the light-emitting device but also to a semiconductor device or the like which functions by utilizing semiconductor characteristics.

As a method for manufacturing a semiconductor device including a flexible substrate, a technique in which after a semiconductor element such as a thin film transistor is formed over a base material such as a glass substrate or a quartz substrate, the semiconductor element is transferred from the base material to another base material (for example, a flexible base material) has been developed. In order to transfer the semiconductor element to the another base material, a step for separating the semiconductor element from the base material that is used in forming the semiconductor element is necessary.

For example, a separation technique using laser ablation is described in Patent Document 1 as follows. A separation layer formed using amorphous silicon or the like is formed over a substrate, a layer to be separated which is formed using a thin film element is formed over the separation layer, and the layer to be separated is bonded to a transfer body with the use of a bonding layer. The separation layer is ablated by laser irradiation, so that separation is generated in the separation layer.

In addition, a technique in which separation is conducted by physical force such as human hands is described in Patent Document 2. In Patent Document 2, a metal layer is formed between a substrate and an oxide layer and separation is generated at an interface between the oxide layer and the metal layer by utilizing weak bonding between the oxide layer and the metal layer at the interface, so that the layer to be separated and the substrate are separated from each other.

Further, in Patent Document 2, an interlayer insulating film is formed over a light-emitting element including an anode, an organic light-emitting layer, and a cathode, and the interlayer insulating film is bonded to a supporting member with the use of a bonding layer. Then, separation is performed at the interface between the oxide layer and the metal layer, and the layer to be separated including the light-emitting element is bonded to a film substrate using the bonding layer, so that a light-emitting device using a flexible substrate is manufactured.

In addition, a display device provided with a touch sensor has attracted attention. The display device provided with a touch sensor is called a touch panel, a touch screen, or the like (hereinafter also referred to simply as a touch panel). A touch panel is used mostly in personal computers or cellular phones and allows image display and operation to be done on the same panel. Further, a display device provided with an optical touch sensor is disclosed in Patent Document 3.

REFERENCE

[Patent Document 1] Japanese Published Patent Application No. H10-125931
[Patent Document 2] Japanese Published Patent Application No. 2003-174153
[Patent Document 3] Japanese Published Patent Application No. 2001-292276

SUMMARY OF THE INVENTION

Here, the light-emitting element formed in the layer to be separated has a structure in which a light-emitting layer is provided between a pair of electrodes. In the case where an organic compound is used for the light-emitting layer, adhesion between the light-emitting layer and an electrode which is a cathode or an anode formed in contact with the light-emitting layer is low. In the case where the adhesion between the light-emitting layer and the electrode is low, the separation may occur at the interface between the light-emitting layer and the electrode when the separation layer is separated from the layer to be separated by physical force. An object of the present invention is to provide a method for manufacturing a light-emitting device including a flexible substrate, in which separation is performed without separation at the interface between the light-emitting layer and the electrode.

In addition, in the case of a light-emitting device using a flexible substrate, there is a possibility that separation may occur at the interface between the light-emitting layer and the electrode, and the light-emitting element may be damaged when physical force such as bending or curving is externally applied. This might become a problem, in particular, when the light-emitting device including a flexible substrate is used as a touch panel.

In view of the above problems, an object of one embodiment of the disclosed invention in this specification and the like is to provide a highly reliable light-emitting device in which a light-emitting element is prevented from being damaged when external physical force is applied.

Since separation is likely to occur at the interface between a light-emitting layer and an electrode, a region without the light-emitting layer is formed at least in part of a region which does not serve as a light-emitting region and a fixed portion where a pair of substrates is fixed is formed in the region. Note that the light-emitting layer may include a hole injection layer, a hole transport layer, an electron transport layer, and an electron injection layer.

A spacer formed of a light absorbing material which absorbs laser light is formed over a partition of one substrate, a coloring layer is formed over the other substrate, and the substrates are bonded to each other with the use of a bonding layer. A light-emitting layer and an electrode which are formed over a spacer are irradiated with laser light through the coloring layer, so that at least the bonding layer among the light-emitting layer, the electrode, the coloring layer, and the bonding layer is melted and the fixed portion where the bonding layer and the spacer are bonded by welding is formed.

As a material of the spacer, a crystalline resin such as nylon 6, nylon 66, aromatic nylon, polybutylene terephthalate, polyethylene terephthalate, polyacetal, polypropylene, or polyphenylene sulfide, or a non-crystalline resin such as polycarbonate, an acrylic resin, or polyarylate polyetherimide is used. Further, carbon black, titanium black, or the like may be mixed into the material of the spacer. The material of the spacer is not particularly limited to a resin as long as it is a light absorbing material, and a metal material such as chromium may be used.

At least the interface between the light-emitting layer and the electrode in a region where the partition is formed is selectively removed by energy of laser light, and a fixed portion is newly formed. By the fixed portion that is newly formed by the laser light irradiation, separation is performed without separation at the interface between the light-emitting layer and the electrode, and a light-emitting device including a flexible substrate can be manufactured.

Note that it is preferable that a beam profile of a laser beam along a cross section perpendicular to an optical axis of laser light delivered have a top flat shape in a focal position.

One embodiment of the present invention is a method for manufacturing a light-emitting device, which includes the steps of forming a first separation layer over a first substrate, a layer including a transistor over the first separation layer, and a pixel electrode connected to the transistor; forming a partition covering the periphery of the pixel electrode; forming a spacer formed of a light absorbing material over the partition; forming a layer including an organic compound over the pixel electrode, the partition, and the spacer; forming an electrode having a light-transmitting property over the layer including the organic compound; forming a second separation layer over a second substrate and a coloring layer over the second separation layer; fixing the first substrate and the second substrate with the use of a bonding layer having a light-transmitting property; after separating the second substrate provided with the second separation layer to expose the coloring layer, irradiating the spacer with laser light through the coloring layer to form a fixed portion on and in contact with the spacer; and separating the first substrate provided with the first separation layer after the laser light irradiation.

In the above structure, the first substrate and the second substrates are glass substrates. Further, the first separation layer and the second separation layer each have a single-layer structure or a stacked structure containing an element selected from tungsten, molybdenum, titanium, tantalum, niobium, nickel, cobalt, zirconium, ruthenium, rhodium, palladium, osmium, iridium, or silicon; an alloy material containing any of the elements; or a compound material containing any of the elements.

In the above structure, after the first substrate provided with the first separation layer is separated, a first flexible substrate is further bonded to the layer including the transistor. In the above structure, after the second substrate provided with the second separation layer is separated, a second flexible substrate is further bonded to the coloring layer. Through these bonding steps, a light-emitting device including a flexible substrate can be manufactured.

In any of the above structures, the light-emitting element emits white light, and light emission from the light-emitting element is extracted through the coloring layer provided for the second flexible substrate. Note that as the first flexible substrate, a metal substrate such a stainless-steel substrate may be used.

In any of the above structures, the coloring layer is a color layer (also referred to as a color filter) which transmits light in a specific wavelength region, or a black matrix.

A structure of a light-emitting device obtained any of the aforementioned methods is also one embodiment of the present invention. The structure of the light-emitting device includes a layer which includes a transistor and is formed over a first flexible substrate; a pixel electrode connected to the transistor; a partition covering the periphery of the pixel electrode; a spacer over the partition; a fixed portion in contact with the spacer; a second flexible substrate provided with a coloring layer; and a bonding layer filling a gap between the first flexible substrate and the second flexible substrate, in which the fixed portion is in contact with the bonding layer and the spacer and is provided between the spacer and the coloring layer.

In the above structure, the bonding layer covers a layer including an organic compound provided over the pixel electrode, and an electrode having a light-transmitting property provided over the layer including the organic compound.

Note that in this specification and the like, the light-emitting device includes an image display device, a light-emitting device, a light source, a lighting device, and the like. Further, the Light-emitting device includes a module in which a connector (FPC: flexible printed circuit) or the like is attached to a panel where a light-emitting element is formed.

In this specification and the like, a light-emitting element includes a layer including an organic compound, at least a light-emitting layer, between a pair of electrodes. Besides the light-emitting layer, a functional layer or the like may be provided between the pair of electrodes.

A fixed portion is formed by laser light irradiation, so that a spacer provided over one substrate and a bonding layer provided between a pair of substrates are firmly fixed to each other and the bonding layer overlaps with a coloring layer provided for the other substrate. Thus, separation is performed without separation at the interface between the light-emitting layer and the electrode, and a light-emitting device including a flexible substrate can be manufactured.

In addition, with the use of a potable information terminal whose weight is reduced by using a flexible substrate, a user can read data regardless of a location and input data by touching a keyboard displayed on a screen; further, the input can be reflected on the display on the screen on which the keyboard is displayed. Even in the case where the user inputs data by touching a keyboard displayed on the screen, pressure is dispersed by arrangement of the spacer, the fixed portion and the coloring layer which overlap one another, and a distance between the substrates can be kept almost constant.

BRIEF DESCRIPTION OF THE DRAWINGS

FIGS. 6A to 6C are cross-sectional views each illustrating one embodiment of the present invention.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Next, an example of an active matrix Light-emitting device is described with reference to FIGS. 1A and 1B. Note that FIG. 1A is a top view of a light-emitting device and FIG. 1B is a cross-sectional view taken along dashed line B1-B2 in FIG. 1A.

Figure 1A:
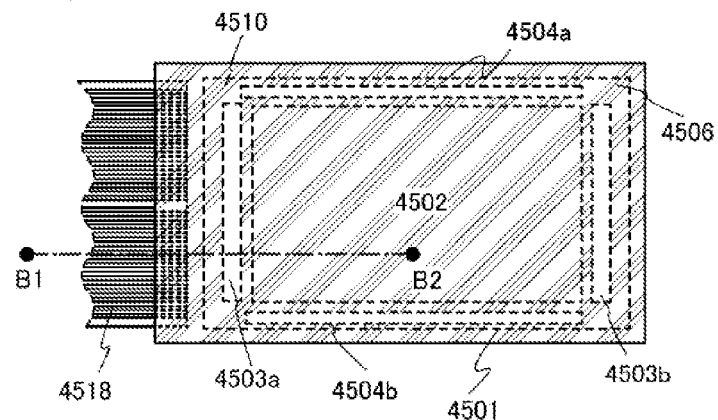
FIGS. 1A and 1B are a top view and a cross-sectional view illustrating one embodiment of the present invention.

The light-emitting device shown in FIG. 1A is provided with a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b.

Note that the first substrate 4501 and the second substrate 4506 are formed using flexible substrates.

Figure 1B:
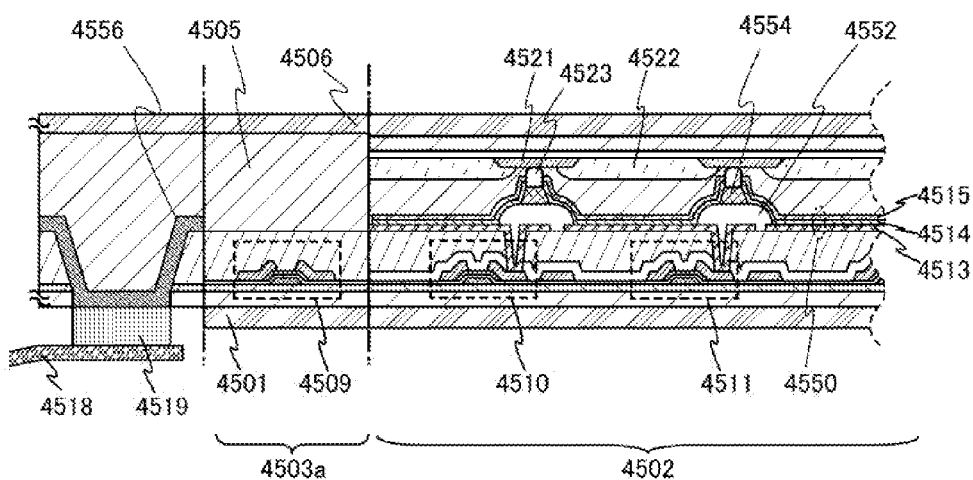

Further, in the light-emitting device shown in FIG. 1B, transistors 4509, 4510, and 4511 are formed over the first substrate 4501, and a light-emitting element 4550 is formed over the transistors 4510 and 4511.

Light from the light-emitting element 4550 is emitted from the second substrate 4506 side. That is, the light-emitting device is a top emission type light-emitting device. Therefore, the second substrate 4506 needs to have a light-transmitting property. For example, a material such as a glass plate, a plastic plate, a polyester film, an acrylic film, or the like is used for the second substrate 4506.

Note that a light shielding film (also referred to as a black matrix) 4521, a color filter 4522 are provided over the second substrate 4506.

Further, the pixel portion 4502, the signal line driver circuits 4503a and 4503b, and the scan line driver circuits 4504a and 4504b are sealed by the first substrate 4501, a first bonding layer 4505, and the second substrate 4506. It is preferable that a panel be packaged (sealed) with a protective film (an attachment film, an ultraviolet curable resin film, or the like) or a cover material with little degasification so that the panel is not exposed to the outside air, which is because the air-tightness becomes high.

Further, the pixel portion 4502, the signal line driver circuits 4503a and 4503b, the scan line driver circuits 4504a and 4504b, which are provided over the first substrate 4501, each include a plurality of transistors. In FIG. 1B, the transistors 4510 and 4511 included in the pixel portion 4502 and the transistor 4509 included in the signal line driver circuit 4503a are illustrated.

The transistors 4509 to 4511 are formed using silicon or an oxide semiconductor layer for a semiconductor layer. In addition, in the pixel portion 4502, the light-emitting element 4550 is formed over the transistors 4510 and 4511.

The light-emitting element 4550 includes a first electrode layer 4513, a light-emitting layer 4514, and a second electrode layer 4515, and is electrically connected to the transistor 4510 or the transistor 4511.

Further, the light-emitting element 4550 is divided by partitions 4552, spacers 4554, and fixed portions 4523.

The partition 4552 is formed using an organic resin film, an inorganic insulating film, or organic polysiloxane. It is particularly preferable that the partition 4552 be formed using a photosensitive material to have an opening over the first electrode layer 4513 so that a sidewall of the opening has an inclined surface with continuous curvature.

Further, the spacer 4554 is provided so as to prevent separation at the interface between the light-emitting layer 4514 and the second electrode layer 4515 when separation is performed. The spacer 4554 is at least partly in contact with the first bonding layer 4505.

The spacer 4554 is in contact with the first bonding layer 4505 in this manner, whereby a region of the spacer 4554, in which adhesion is increased, is provided. The spacer can contribute to an increase the adhesion, and the light-emitting element 4550 is protected by the provision of the spacer 4554 between the pair of substrates. Thus, by the spacer 4554, the light-emitting element 4550 can be prevented from being damaged when external physical force is applied.

In addition, a variety of signals and potentials are supplied from an FPC 4518 to the signal line driver circuits 4503a and 4503b, the scan line driver circuits 4504a and 4504b, or the pixel portion 4502.

In this embodiment, a structure in which an FPC 4518 is mounted on the first substrate 4501 side is illustrated. The first substrate 4501 and the second substrate 4506 are formed using flexible substrates. It is difficult to expose a connection terminal of the FPC 4518 to the second substrate 4506 side since the light-emitting device is formed to be flexible. Thus, a through electrode 4556 is formed in a region to which the FPC 4518 is connected, so that a method of connecting the FPC 4518 from the first substrate 4501 side is preferable. Note that the method of connecting the FPC 4518 is not limited thereto, and the FPC 4518 may be connected from the second substrate 4506 side.

The through electrode 4556 is electrically connected to a terminal included in the FPC 4518 through an anisotropic conductive film 4519.

If necessary, an optical film such as a polarizing plate, a circularly polarizing plate (including an elliptically polarizing plate), a retardation plate (a quarter-wave plate or a half-wave plate), or the like may be appropriately provided for the second substrate 4506. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Only the signal line driver circuits or part thereof, or only the scan line driver circuits or part thereof may be separately formed and mounted. This embodiment is not limited to the structure illustrated in FIGS. 1A and 1B.

As described above, according to this embodiment, it is possible to provide a highly reliable light-emitting device in which by the provision of the spacer 4554 and the fixed portion 4523 between the pair of substrates, a light-emitting element is prevented from being damaged when external physical force is applied.

Embodiment 2

A method for manufacturing the light-emitting device illustrated in FIGS. 1A and 1B will be described with reference to FIGS. 2A to 2D, FIGS. 3A to 3C, FIGS. 4A and 4B, and FIGS. 5A and 5B.

First, a first separation layer 101 is formed over a third substrate 180, and a first buffer layer 104 is formed over the first separation layer 101. It is preferable that the first buffer layer 104 be formed successively so that the first separation layer 101 is not exposed to air. The successive formation prevents dust or impurities from entering a portion between the first separation layer 101 and the first buffer layer 104 (see FIG. 2A).

The third substrate 180 may be a glass substrate, a quartz substrate, a sapphire substrate, a ceramic substrate, a metal substrate, or the like. Alternatively, a plastic substrate which can withstand the processing temperature of this embodiment may be used. In the case where a plastic substrate is used, the separation layer 101 is not necessarily provided.

When the temperature of heat treatment performed later is high, a substrate having a strain point of 730° C. or higher is preferably used as the glass substrate. As a glass substrate, a glass material such as aluminosilicate glass, aluminoborosilicate glass, or barium borosilicate glass is used, for example.

In this embodiment, the first separation layer 101 is formed in contact with the third substrate 180; however, when a glass substrate is used for the third substrate 180, it is further preferable to form an insulating layer such as a silicon oxide film, a silicon oxynitride film, a silicon nitride film, or a silicon nitride oxide film between the third substrate 180 and the first separation layer 101 because contamination from the glass substrate can be prevented by the formation of the insulating layer.

The first separation layer 101 has a single-layer structure or a stacked structure containing an element selected from tungsten, molybdenum, titanium, tantalum, niobium, nickel, cobalt, zirconium, ruthenium, rhodium, palladium, osmium, iridium, or silicon; an alloy material containing any of the elements; or a compound material containing any of the elements. A crystal structure of a layer including silicon may be amorphous, microcrystal, or polycrystal.

The first separation layer 101 can be formed by a sputtering method, a plasma CVD method, a coating method, a printing method, or the like. Note that the coating method includes a spin coating method, a droplet discharge method, and a dispensing method.

When the first separation layer 101 has a single-layer structure, preferably, a tungsten layer, a molybdenum layer, or a layer including a mixture of tungsten and molybdenum is formed. Alternatively, a layer including an oxide or an oxynitride of tungsten, a layer including an oxide or an oxynitride of molybdenum, or a layer including an oxide or an oxynitride of a mixture of tungsten and molybdenum is formed. Note that the mixture of tungsten and molybdenum corresponds to an alloy of tungsten and molybdenum, for example.

When the first separation layer 101 has a stacked structure including a layer including tungsten and a layer including an oxide of tungsten, it may be utilized that the layer including tungsten is formed first and an insulating layer formed of oxide is formed thereover so that a layer including an oxide of tungsten is formed at the interface between the tungsten layer and the insulating layer. Alternatively, the layer including oxide of tungsten may be formed by performing thermal oxidation treatment, oxygen plasma treatment, treatment with a highly oxidizing solution such as ozone water, or the like on the surface of the layer including tungsten. Further, plasma treatment or heat treatment may be performed in an atmosphere of oxygen, nitrogen, nitrous oxide alone, or a mixed gas of any of these gasses and another gas. Surface condition of the first separation layer 101 is changed by the plasma treatment or heat treatment, whereby adhesion between the first separation layer 101 and the first buffer layer 104 to be formed later can be controlled.

Next, the first buffer layer 104 is formed over the first separation layer 101. The first buffer layer 104 is preferably formed using a single layer or stacked layers of a silicon nitride layer, a silicon oxynitride layer, a silicon nitride oxide layer, or the like.

The first buffer layer 104 can be formed by a sputtering method, a plasma CVD method, a coating method, a printing method, or the like. For example, the first buffer layer 104 is formed at a temperature of higher than or equal to 250° C. and lower than or equal to 400° C. by a plasma CVD method, whereby a dense film having very low water permeability can be obtained. Note that the thickness of the first buffer layer 104 is preferably greater than or equal to 10 nm and less than or equal to 3000 nm, further preferably greater than or equal to 200 nm and less than or equal to 1500 nm.

Figure 2A:
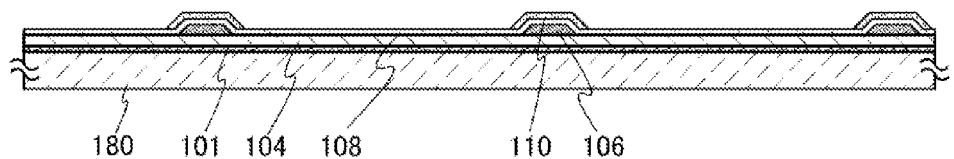
FIGS. 2A to 2D are cross-sectional views illustrating manufacturing steps of one embodiment of the present invention.

After that, a conductive film is formed over the first buffer layer 104, and a gate electrode layer 106 is formed by photolithography (see FIG. 2A).

The gate electrode layer 106 can be formed using a single layer or stacked layers of a metal material such as molybdenum, titanium, chromium, tantalum, tungsten, aluminum, copper, neodymium, or scandium, or an alloy material which contains any of these elements.

A gate insulating layer 108 is formed over the gate electrode layer 106. The gate insulating layer 108 can be formed using a single layer or stacked layers of silicon oxide, silicon nitride, silicon oxynitride, silicon nitride oxide, or aluminum oxide by a plasma CVD method, a sputtering method, or the like. For example, a silicon oxynitride film may be formed using a deposition gas containing $SiH_4$, and $N_2O$ by a plasma CVD method.

Next, a semiconductor layer is formed, and an island-shaped semiconductor layer 110 is formed by photolithography (see FIG. 2A).

The semiconductor layer 110 can be formed using a silicon semiconductor or an oxide semiconductor. Examples of a silicon semiconductor are single crystal silicon and polycrystalline silicon. An oxide semiconductor preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

An oxide semiconductor which is an In—Ga—Zn-based metal oxide is preferably used as the semiconductor layer 110 to form a transistor having low off-state current because an off-state leakage current of a light-emitting element to be formed later can be reduced.

Figure 2B:
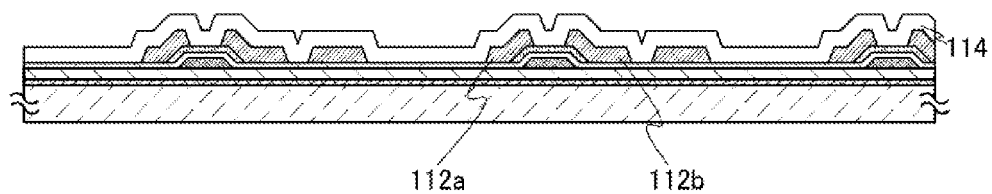

Next, a conductive film is formed over the gate insulating layer 108 and the semiconductor layer 110, and a source electrode layer 112a and a drain electrode layer 112b are formed by photolithography (see FIG. 2B).

As the conductive film used for the source electrode layer 112a and the drain electrode layer 112b, for example, a metal film including an element selected from Al, Cr, Cu, Ta, Ti, Mo, and W, a metal nitride film including any of these elements (a titanium nitride film, a molybdenum nitride film, or a tungsten nitride film), or the like can be used. A metal film having a high melting point such as Ti, Mo, or W, or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer 112a and the drain electrode layer 112b may be formed using a conductive metal oxide. As the conductive metal oxide, indium oxide ($In_2O_3$ or the like), tin oxide (SnO, or the like), zinc oxide (ZnO), ITO, indium oxide-zinc oxide ($In_2O_3$—ZnO or the like), or any of these metal oxide materials in which silicon oxide is contained can be used.

Then, the first insulating layer 114 is formed over the semiconductor layer 110, the source electrode layer 112a, and the drain electrode layer 112b (see FIG. 2B). As the first insulating layer 114, typically, an inorganic insulating film such as a silicon oxide film, a silicon oxynitride film, or an aluminum oxide film can be used.

Figure 2C:
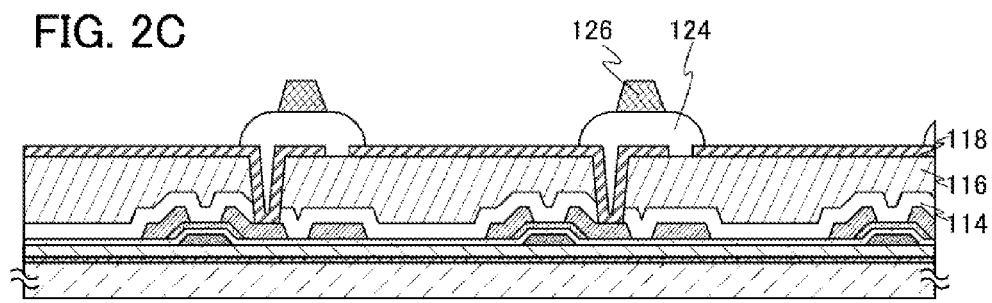

Next, a second insulating layer 116 is formed over the first insulating layer 114 (see FIG. 2C).

As the second insulating layer 116, an insulating film with a planarization function is preferably selected in order to reduce surface unevenness due to a transistor. For example, an organic material such as a polyimide resin, an acrylic resin, or a benzocyclobutene resin can be used. Other than such organic materials, it is also possible to use a low-dielectric constant material (a low-k material) or the like. Note that the second insulating layer 116 may be formed by stacking a plurality of insulating films formed using any of these materials.

Next, an opening which reaches the drain electrode layer 112b is formed in the first insulating layer 114 and the second insulating layer 116 by photolithography. As a method for forming the opening, a dry etching method, a wet etching method, or the like may be selected as appropriate.

Then, a conductive film is formed over the second insulating layer 116 and the drain electrode layer 112b, and a photolithography step is performed thereon, whereby a first electrode layer 118 is formed (see FIG. 2C).

As the first electrode layer 118, a material which reflects light emitted from the light-emitting layer 120 (to be formed later) efficiently is preferable. This is because light-extraction efficiency can be improved. Note that the first electrode layer 118 may have a stacked structure. For example, a conductive film of a metal oxide, a titanium film, or the like can be formed thin on the side which is in contact with the light-emitting layer 120, and a metal film (aluminum, an alloy of aluminum, silver, or the like) which has high reflectance can be used on the other side. With such a structure, formation of an insulating film between the light-emitting layer 120 and the metal film (aluminum, an alloy of aluminum, silver, or the like) which has high reflectance can be suppressed, which is preferable.

In this embodiment, the light-emitting device having a top emission structure is described. However, with the use of a light-transmitting material for the first electrode layer 118, a light-emitting device having a bottom emission structure and a dual emission structure can be manufactured.

Subsequently, a partition 124 is formed over the first electrode layer 118 (see FIG. 2C).

The partition 124 is formed using an organic insulating material or an inorganic insulating material. It is particularly preferable that the partition be formed using a photosensitive resin material to have an opening so that a sidewall of the opening has an inclined surface with continuous curvature.

Then, a spacer 126 is formed over the partition 124 (see FIG. 2C).

A material of the spacer 126 is important because the spacer 126 needs to absorb laser light to be delivered later. As materials for the spacer, a crystalline resin such as nylon 6, nylon 66, aromatic nylon, polybutylene terephthalate, polyethylene terephthalate, polyacetal, polypropylene, or polyphenylene sulfide, or a non-crystalline region such as polycarbonate, an acrylic resin, or polyarylate polyetherimide is used. Further, carbon black, titanium black, or the like may be mixed into the material for the spacer. The material for the spacer 126 is not particularly limited to a resin as long as it is a light absorbing material, and a metal material which has low reflectance, such as titanium or chromium may be used. Further, the spacer 126 may have a stacked structure of the aforementioned resin and metal.

The cross-section of the spacer 126 described in this embodiment has a tapered shape. Alternatively, the cross-section of the spacer 126 may have a rectangular shape, or an inverse tapered shape. The inverse tapered shape as used herein refers a shape in which the side portion or the upper portion thereof is on the outer side than the bottom portion in the direction parallel to the substrate. Further, the upper surface of the spacer 126 described in this embodiment may have a circular shape, an elliptical shape, a polygonal shape, a linear shape, or a grid shape when the spacer is formed so as to overlap with the upper portion of the partition 124.

Subsequently, the light-emitting layer 120 is formed over the first electrode layer 118, the partition 124, and the spacer 126 (see FIG. 2D).

The light-emitting layer 120 can be formed by an evaporation method (including a vacuum evaporation method), or the like. The light-emitting layer 120 may have a single-layer or a stacked structure. Light emitted from the light-emitting layer 120 is preferably white, and light having a peak in each of red, green, and blue wavelength regions is preferable.

In this embodiment, a structure in Which light emitted from the light-emitting layer 120 is emitted through a color filter 166 is illustrated; however, the structure is not limited thereto. A structure may be employed in which the light-emitting layers 120 separately colored with different colors (e.g., R, G, and B) are formed without the coloring layer 166. However, the number of steps and the cost may be increased by separately coloring the light-emitting layers 120 with different colors; thus, the structure using a white light-emitting layer 120 and the coloring layer 166 described in this embodiment is preferable.

Further, the light-emitting layer 120 is formed over the top surface and the side surface of the spacer 126.

Figure 2D:
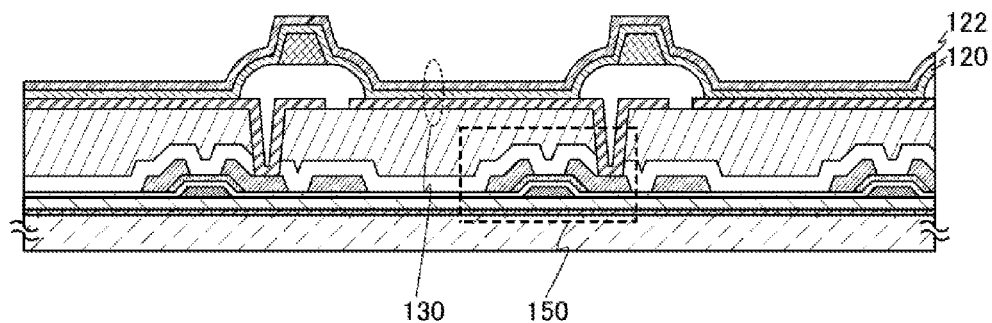

Next, a second electrode layer 122 is formed over the light-emitting layer 120 (see FIG. 2D). The second electrode layer 122 is also formed to cover the top surface and the side surface of the spacer 126.

The second electrode layer 1.22 can be formed using a light-transmitting metal oxide. As the light-transmitting metal oxide, indium oxide ($In_2O_3$ or the like), tin oxide ($SnO_2$ or the like), zinc oxide (ZnO), indium oxide-tin oxide ($In_2O_3$—$SnO_2$ or the like, which is abbreviated to ITO), indium oxide-zinc oxide ($In_3O_3$—ZnO or the like), or any of these metal oxide materials in which silicon oxide is contained can be used.

Note that one of the first electrode layer 118 and the second electrode 122 functions as an anode of the light-emitting layer 120, and the other functions as a cathode of the light-emitting layer 120. It is preferable to use a substance having a high work function for the electrode which functions as an anode, and a substance having a low work function for the electrode which functions as a cathode.

A light-emitting element 130 is formed using the first electrode layer 118, the light-emitting layer 120, and the second electrode layer 122.

Through the above steps, the third substrate 180 provided with a transistor 150 which control driving of a Light-emitting element, and the light-emitting element 130 is formed.

Next, a method for manufacturing a fourth substrate 190 over which a light shielding film 164 and the color filter 166 are formed is described below.

Figure 3A:
FIGS. 3A to 3C are cross-sectional views illustrating manufacturing steps of one embodiment of the present invention.

First, a second separation layer 161 is formed over the fourth substrate 190 and then a second buffer layer 162 is formed over the second separation layer 161 (see FIG. 3A).

The second separation layer 161 and the second buffer layer 162 can be formed using a material and a method similar to those of the first separation layer 101 and the first buffer layer 104 which are described above.

Figure 3B:
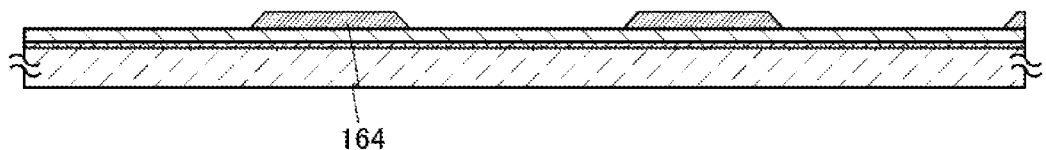

Then, a conductive film is formed over the second buffer layer 162, and a photolithography is performed thereon, whereby the light shielding film 164 is formed (see FIG. 3B).

By the light shielding film 164, mixture of colors of adjacent pixels can be prevented. There is no limitation on the light shielding film 164 as long as it is formed of a material which transmits laser light; for example, an organic resin film impregnated with a black pigment or a black dye, or the like can be used. Further, the light shielding film 164 can also be called a black coloring layer. If mixture of colors of adjacent pixels does not cause a problem, the light shielding film 164 is not necessarily provided. Further, different coloring layers, for example, a blue coloring layer and a green coloring layer may be provided to overlap with each other to have the same function as the light shielding film 164.

Figure 3C:
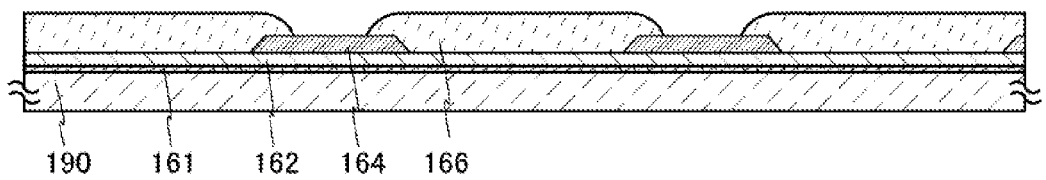

Next, the coloring layer 166 is formed over the second buffer layer 162 and the light shielding film 164 (see FIG. 3C).

The coloring layer 166 is also called a color filter and is a color layer which transmits light in a specific wavelength region. For example, a red (R) coloring layer which transmits light of a red wavelength region, a green (G) coloring layer which transmits light of a green wavelength region, a blue (B) coloring layer which transmits light of a blue wavelength region, and the like can be used. Each coloring layer is formed in a desired position with a known material by a printing method, an inkjet method, etching using a photolithography technique, or the like.

Here, a method of using three colors of R, G, and B is described; however, the present invention is not limited thereto. A structure in which four colors of R, G, B, and Y (yellow) are used or a structure in which five or more colors are used is possible.

Through the above steps, the fourth substrate 190 over which the second separation layer 161, the second butler layer 162, the light shielding film 164, and the coloring layer 166 are formed is formed. Although an overcoat layer formed using an organic resin film such as an acrylic film or a polyimide film may be provided to cover the coloring layer, in this embodiment, the overcoat layer is not provided so as to prevent moisture and an impurity element contained in the overcoat layer from diffusing into the light-emitting element. The number of steps for forming the overcoat layer can be cut because the overcoat layer is not provided.

Figure 4A:
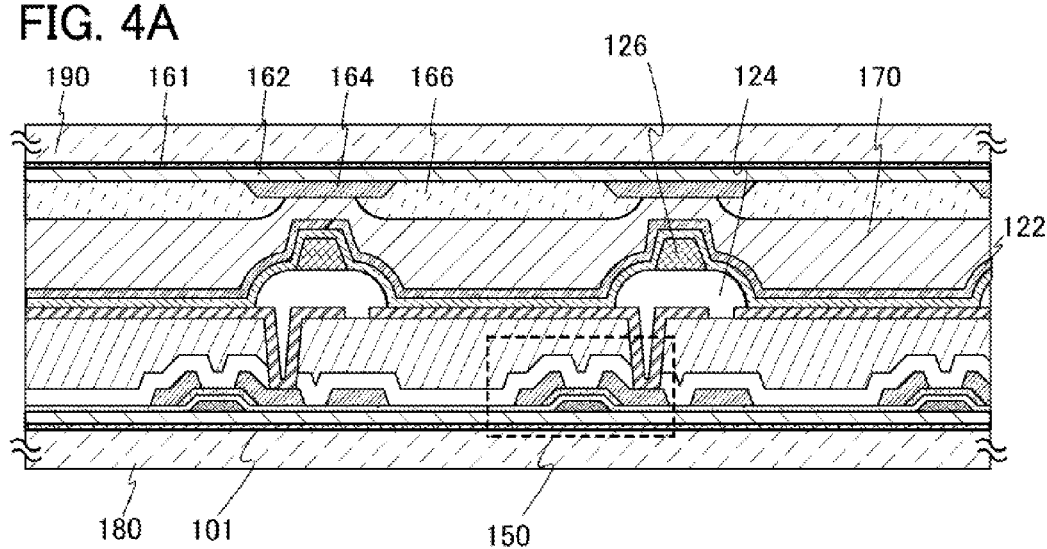
FIGS. 4A and 4B are cross-sectional views illustrating manufacturing steps of one embodiment of the present invention.

Next, the third substrate 180 and the fourth substrate 190 are aligned and bonded to each other using a first bonding layer 170 (see FIG. 4A).

There is no limitation on the first bonding layer 170 as long as it is formed of a material which transmits laser light to be delivered later, and a light-transmitting adhesive whose refractive index is high and capable of bonding the third substrate 180 and the fourth substrate 190 can be used. A thy agent (zeolite or the like) having a size less than or equal to the wavelength of light, or a filler with a high refractive index (titanium oxide, zirconium, or the like) is preferably mixed into the adhesive because reliability and light-extraction efficiency of the light-emitting element 130 are improved.

Figure 4B:
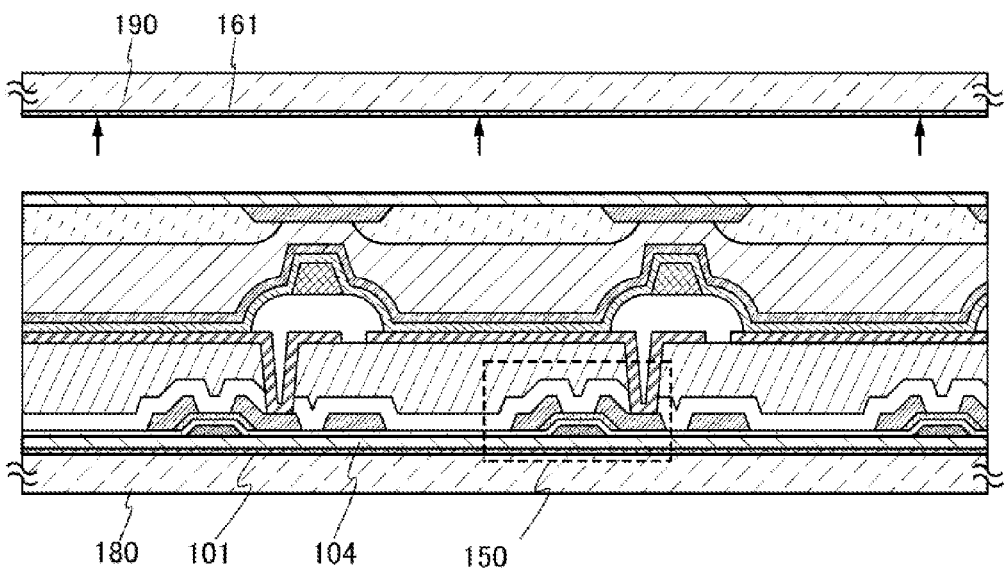

Next, separation is performed between the second separation layer 161 and the second buffer layer 162 which are provided for the fourth substrate 190 (see FIG. 4B). As a separation method, any of various methods can be employed.

For example, a metal oxide film is formed at the interface between the second separation layer 161 and the second buffer layer 162 by heating the second separation layer 161 and the second buffer layer 162 in a step of forming the transistor 150. A groove (not shown) reaching the second separation layer 161 is formed by laser light irradiation, and the metal oxide film is embrittled because of the groove, so that the separation occurs at the interface between the second separation layer 161 and the second buffer layer 162.

As the separation method, mechanical force (a separation process with a human hand or with a gripper, a separation process by rotation of a roller, or the like) may be used. Alternatively, the second buffer layer 162 may be separated from the second separation layer 161 in such a manner that a liquid is dropped into the groove to allow the liquid to be infiltrated into the interface between the second separation layer 161 and the second buffer layer 162. Further alternatively, a method may be used in which a fluoride gas such as $NF_3$, $BrF_3$, or $ClF_3$ is introduced into the groove and the second separation layer 161 is removed by etching with the use of the fluoride gas so that the second buffer layer 162 is separated from the fourth substrate 190.

As another separation method, in the case where the second separation layer 161 is formed using tungsten, separation can be performed while the second separation layer 161 is etched by a mixed solution of ammonia water and hydrogen peroxide water.

When a film containing nitrogen, oxygen, hydrogen, or the like (e.g., an amorphous silicon film containing hydrogen, an alloy film containing hydrogen, or an alloy film containing oxygen) is used as the second separation layer 161 and a substrate having a light-transmitting property is used as the fourth substrate 190, the following method can be used: the second separation layer 161 is irradiated with laser light through the fourth substrate 190, and nitrogen, oxygen, or hydrogen contained in the second separation layer 161 is evaporated, so that separation is performed between the fourth substrate 190 and the second separation layer 161.

Next, the spacer 126 is irradiated with a laser beam 103 (e.g., UV light) through the light shielding film 164 so that laser light is absorbed by the spacer 126, and the light-emitting layer 120 or the second electrode layer 122 formed over the top surface of the spacer 126 is melted by the heat. Further, part of the first bonding layer 170 is melted by the heat, and a fixed portion 168 that is a mixture is formed (see FIG. 5A). The fixed portion 168 thus formed has high adhesion to the spacer 126 and the first bonding layer 170. Further, the fixed portion 168 as well as the spacer 126 has a function of keeping a distance between the substrates. Note that the size of the fixed portion 168 is proportional to the area of a region irradiated with the laser beam.

For the laser beam 103 used for irradiation, a gas laser typified by an excimer laser or a solid-state laser typified by a YAG laser can be used as a light source. The solid laser is small and excellent in productivity; thus, the wavelength of the laser beam is preferably within an infrared light region, and a wavelength of 780 nm to 2000 nm is employed. When a resin material is bonded by welding to form the fixed portion, laser beam with lower energy is preferable, and the wavelength of the laser beam is preferably within an infrared region so that laser beam passes through the coloring layer and the light shielding film. Because laser beam with low energy within an infrared region is used, the fixed portion 168 which is bonded with the first bonding layer 170 by welding without causing carbonization of the resin material and the like can be formed. The laser beam emitted from the light source is preferably converged to a rectangular or linear shape by an optical system, and irradiation may be performed by scanning the laser beam on an objective surface.

Figures 9A, 9B:
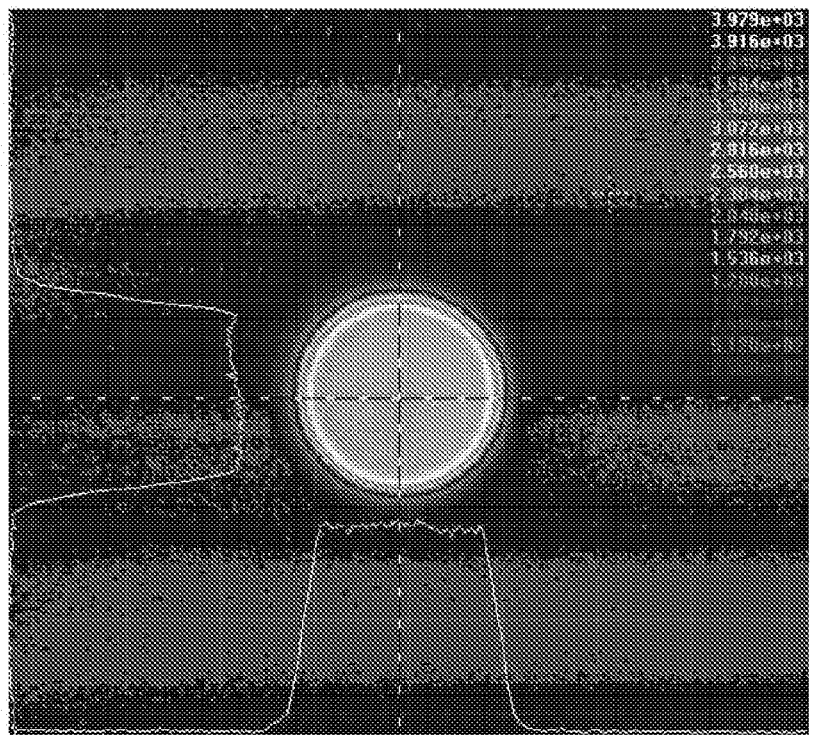
FIGS. 9A and 9B are diagrams each illustrating an example of a beam shape and laser profiles.

Note that it is preferable that a beam profile of a laser beam along a cross section perpendicular to an optical axis of the laser beam have a top flat shape in a focal position by adjustment of the optical system. FIGS. 9A and 9B each illustrate an example of a beam shape and beam profiles. In FIGS. 9A and 9B, the beam profile in the transverse direction, which is obtained by cutting the laser beam along a dashed line passing through the center of the beam shape and being parallel to the horizontal axis (lateral side), and the beam profile in the longitudinal directions, which is obtained by cutting along a dashed line passing through the center of the beam shape and being parallel to the vertical axis (longitudinal side) are shown by white lines. FIG. 9B shows an example in which the beam profiles along cross sections perpendicular to an optical axis of the laser beam each has a Gaussian distribution; however, in this embodiment, a laser beam having a beam profile having a top flat shape in a focal position is preferable to a laser beam having a beam profile having a Gaussian distribution.

Figure 5A:
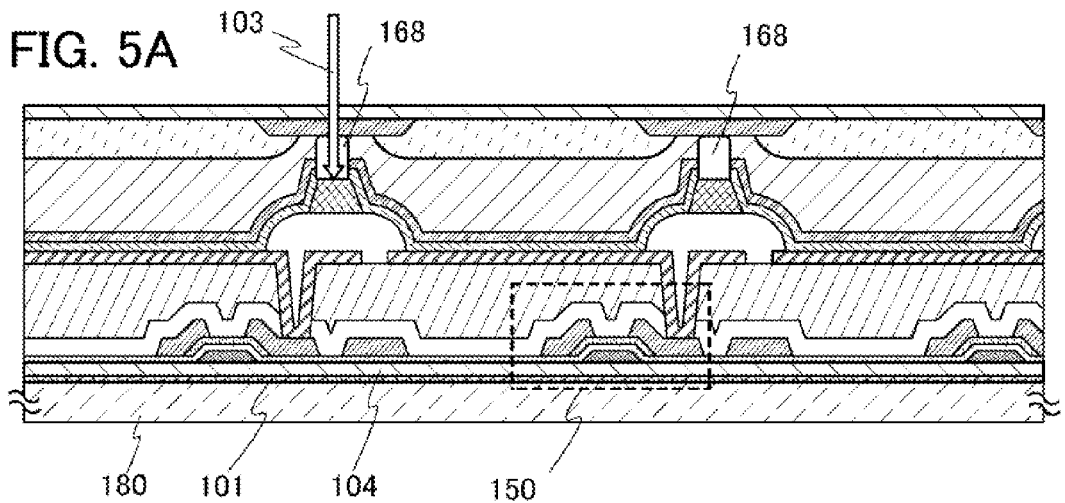
FIGS. 5A and 5B are cross-sectional views illustrating manufacturing steps of one embodiment (lithe present invention.
Figure 5B:
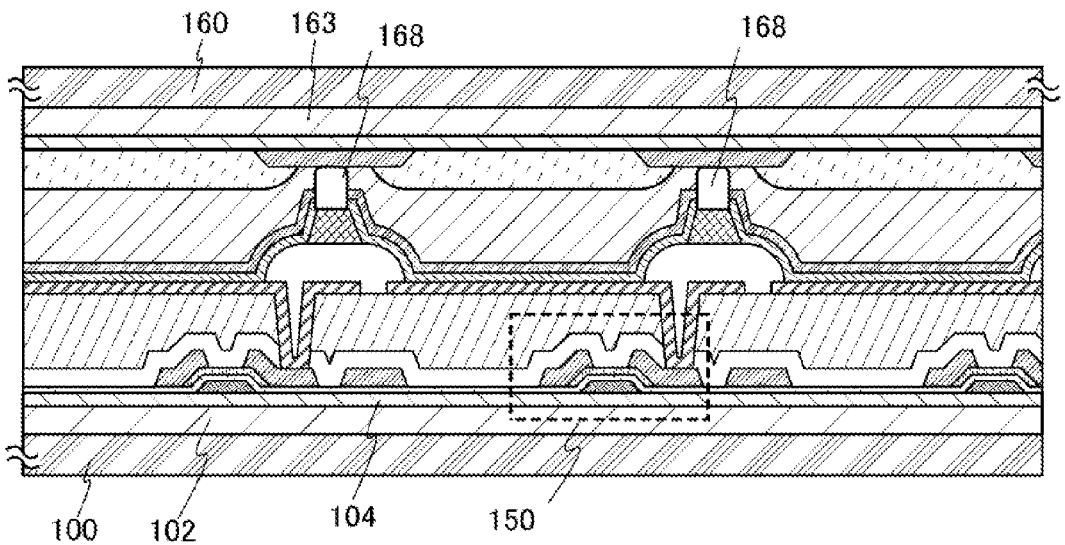

Next, a second substrate 160 is bonded to the second buffer layer 162 using a third bonding layer 163 (see FIG. 5B). In this specification and the like, a process in which a buffer layer formed over a separation layer is separated from the separation layer formed over a substrate and is bonded to another substrate is referred to as separation and transfer.

As the second substrate 160, a substrate having flexibility and a light-transmitting property with respect to visible light can be used. For example, it is preferable to use a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, or a polyvinylchloride resin, or the like. In addition, over the first substrate 100, a protective film having low water permeability may be formed in advance, and examples thereof include a film containing nitrogen and silicon such as a silicon nitride film or a silicon oxynitride film, a film containing nitrogen and aluminum such as an aluminum nitride film, and the like. Note that a structure in which a fibrous body is impregnated with an organic resin (also referred to as so-called a prepreg) may be used as the second substrate 160.

As the third bonding layer 163, various curable adhesives, e.g., a light curable adhesive such as a UV curable adhesive, a reactive curable adhesive, a thermal curable adhesive, and an anaerobic curable adhesive can be used. As the material of the adhesive, an epoxy resin, an acrylic resin, a silicone resin, a phenol resin, or the like can be used.

Note that in the case where a prepreg is used as the second substrate 160, the second substrate 160 and the second buffer layer 162 may be bonded to each other by pressure bonding without using the third bonding layer 163.

Separation is performed between the first separation layer 101 and the first buffer layer 104 which are formed over the third substrate 180.

Subsequently, the first substrate 100 is bonded to the first buffer layer 104 using the second bonding layer 102 (see FIG. 5B).

The separation can be performed by a method similar to the above described method used for the separation between the second separation layer 161 and the second buffer layer 162 which are provided for the fourth substrate 190. The first substrate 100 and the second bonding layer 102 can be formed using materials and methods which are similar to those of the second substrate 160 and the third bonding layer 163, respectively.

Through these steps, a light-emitting device formed over a flexible substrate can be manufactured.

In this embodiment, a method is illustrated in which the fourth substrate 190 is separated and then the third substrate 180 is separated by using the irradiation of a laser beam. However, the invention disclosed in this specification is not limited thereto, and the following method may be employed in which the fourth substrate 190 and the third substrate 180 are separated after the irradiation of a laser beam.

Although an active matrix light-emitting device is described as an example of a light-emitting device in this embodiment, the present invention can also be applied to a passive matrix light-emitting device.

As described, above, a highly reliable light-emitting device can be provided in which by the formation of the spacer and the fixed portion, a light-emitting element is prevented from being damaged when external physical force is applied.

Further, even in the case where separation and transfer which are described in this embodiment are used as a method for making a flexible device, a light-emitting element can be prevented from being damaged and can be transferred to a flexible substrate after the separation by the provision of the spacer and fixed portion which are described above.

Furthermore, the spacer and fixed portion which are described above are preferably provided so as to overlap with a partition of a pixel portion.

Embodiment 2 can be implemented in combination with the structure described in Embodiment 1 as appropriate.

Embodiment 3

Structures of a spacer, a coloring layer, and a fixed portion which are used in the light-emitting device of this invention, which are different from those of the spacer 126, the coloring layer 166, and the fixed portion 168 which are described in Embodiment 2, are described with reference to FIGS. 6A to 6C.

Note that the same reference numerals are used for the same parts as those of the light-emitting device in Embodiment 1, and description of the parts with the same reference numerals will be omitted here.

A light-emitting device in FIG. 6A is an example in which a spacer 208 is bonded to the first bonding layer 170 by welding and also bonded to the partition 124 by welding by laser light irradiation. A material which absorbs visible light is added to the spacer 208, and the spacer 208 is firmly fixed to the first bonding layer 170 and the partition 124. Further, the light-emitting layer 120 formed on the top surface and part of the side surface is separated by the laser light irradiation.

Further, a light-emitting device in FIG. 6B is an example in which the light shielding film 164 is formed after the formation of the coloring layer 166. The spacer 126 is bonded to the light shielding film 164 and the first bonding layer 170 by welding by laser light irradiation.

A light-emitting device in FIG. 6C is an example in which different coloring layers are provided to overlap with each other so as to function as a black matrix without providing a light shielding film. The spacer 126 is bonded to the coloring layer 171 and the first bonding layer 170 by welding by laser light irradiation.

In any structure, by the laser light irradiation, the light-emitting layer 120 is separated and the spacer is in contact with the first bonding layer 170. With this structure, a region of the spacer, which is in contact with the first bonding layer 170 without the light-emitting layer 120 interposed therebetween is provided, whereby adhesion can be increased. Thus, by the provision of the region having high adhesion in the spacer, the light-emitting element 130 can be prevented from being damaged when external physical force is applied.

Embodiment 3 can be implemented in appropriate combination with the structures described in the other embodiments.

Embodiment 4

In this embodiment, details of the light-emitting element 130 including the first electrode layer 118, the light-emitting layer 120, and the second electrode layer 122 which are described in Embodiment 2 will be described with reference to FIGS. 7A and 7B.

(Structure of Light-Emitting Element)

Figure 7A:
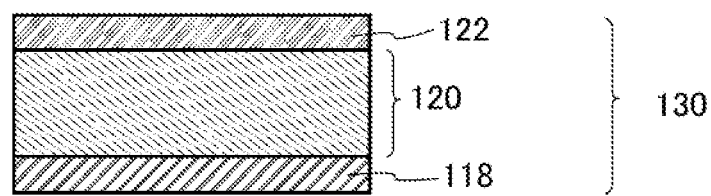
FIGS. 7A and 7B are cross-sectional views each illustrating one embodiment of the present invention.

The light-emitting element 130 shown in FIG. 7A has a structure in which the light-emitting layer 120 including a light-emitting region is sandwiched between a pair of electrodes (the first electrode layer 118 and the second electrode layer 122). Note that the first electrode layer 118 is used as an anode and the second electrode 122 is used as a cathode as an example in the following description of this embodiment.

The light-emitting layer 120 only needs to include at least a light-emitting layer, and may also have a stacked structure including a functional layer in addition to the light-emitting layer. Examples of the functional layer other than the light-emitting layer include a layer including a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

The light-emitting element 130 shown in FIG. 7A emits light when current flows because of a potential difference generated between the first electrode layer 118 and the second electrode layer 122, and holes and electrons are recombined in the light-emitting layer 120. That is, a light-emitting region is formed in the light-emitting layer 120.

In this invention, light emission from the light-emitting element 130 is extracted to the outside from the first electrode layer 118 or the second electrode layer 122 side. Accordingly, one or both of the first electrode layer 118 or the second electrode layer 122 is/are formed using a substance having a light-transmitting property.

Figure 7B:
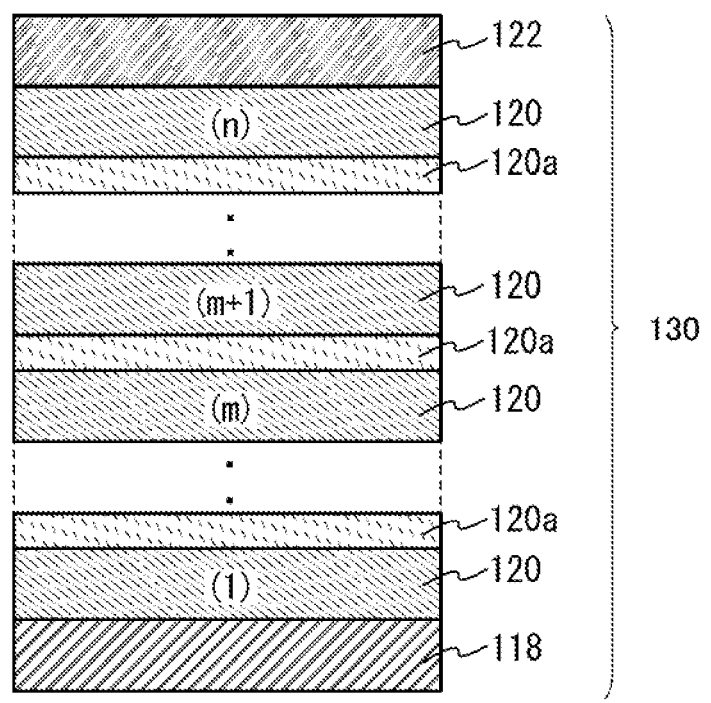

Note that a plurality of light-emitting layers 120 may be stacked between the first electrode layer 118 and the second electrode layer 122 as shown in FIG. 7B. In the case where n (n is a natural number of 2 or more) layers are stacked, a charge generation layer 120a is preferably provided between each m-th (m is a natural number of 1 to n−1) EL layer and each (m+1)-th EL layer.

The charge generation layer 120a may be formed of a composite material of an organic compound and a metal oxide, a metal oxide, or a composite material of an organic compound and an alkali metal, an alkaline earth metal, or a compound thereof; alternatively, these materials may be combined as appropriate. The composite material of an organic compound and a metal oxide includes an organic compound and a metal oxide such as vanadium oxide, molybdenum oxide, or tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use an organic compound which has a hole-transport property and has a hole mobility of $10^{-6}$ cm$^2$/Vs or higher. However, other substances than the above described materials may also be used as long as the substances have higher hole-transport properties than electron-transport properties. These materials used for the charge generation layer 120a are excellent in carrier-injection property and carrier-transport property, and thus the light-emitting element 130 can be driven with low current and with low voltage.

It is to be noted that the charge generation layer 120a may be formed with a combination of a composite material of an organic compound and a metal oxide and another material. For example, a layer including a composite material of an organic compound and a metal oxide may be combined with a layer including a compound selected from substances with electron-donating properties and a compound with a high electron-transport property. Moreover, a layer including a composite material of the organic compound and the metal oxide may be combined with a transparent conductive film.

As for the light-emitting element 130 having such a structure, problems such as energy transfer, quenching, and the like are unlikely to occur, and a light-emitting element which has both high light emission efficiency and long lifetime is easily obtained due to expansion in the choice of materials. Further, a light-emitting element which provides phosphorescence from one of light-emitting layers and fluorescence from the other of the light-emitting layers can be easily obtained.

Note that the charge generation layer 120a has a function of injecting holes to one of the light-emitting layers 120, which is formed in contact with the charge generation layer 120a, and a function of injecting electrons to the other of the light-emitting layers 120, when voltage is applied between the first electrode layer 118 and the second electrode layer 122.

The light-emitting element 130 shown in FIG. 7B can provide a variety of emission colors by changing the type of the light-emitting substance which is used for the light-emitting layer 120. In addition, by the use of a plurality of light-emitting substances of different colors as the light-emitting substance, light emission having a broad spectrum or white light emission can also be obtained.

In the case of obtaining white light emission using the light-emitting element 130 shown in FIG. 7B, as for a combination of a plurality of light-emitting layers, a structure for emitting white light including red light, blue light, and green light may be used. For example, the structure may include a first light-emitting layer including a blue fluorescent substance as a light-emitting substance and a second light-emitting layer including green and red phosphorescent substances as light-emitting substances. Alternatively, a structure including a first light-emitting layer exhibiting red light; a second light-emitting layer exhibiting green light, and a third light-emitting layer exhibiting blue light may be employed. Also with a structure including light-emitting layers emitting light of complementary colors, white light emission can be obtained. When light emission from the first light-emitting layer and light emission from the second light-emitting layer have complementary colors to each other in a stacked element including two light-emitting layers, the combination of colors are as follows: blue and yellow, blue-green and red, and the like.

Note that in the structure of the above-mentioned stacked element, by the provision of the charge generation layer between the stacked light-emitting layers, the element can have long lifetime in a high-luminance region while keeping the current density low. In addition, the voltage drop due to resistance of the electrode material can be reduced, whereby uniform light emission in a large area is possible.

Embodiment 4 can be implemented in appropriate combination with the structures described in the other embodiments.

Embodiment 5

In this embodiment, a mobile phone incorporating the light-emitting device described in Embodiment 1 will be described with reference to FIGS. 8A and 8B.

Figure 8A:
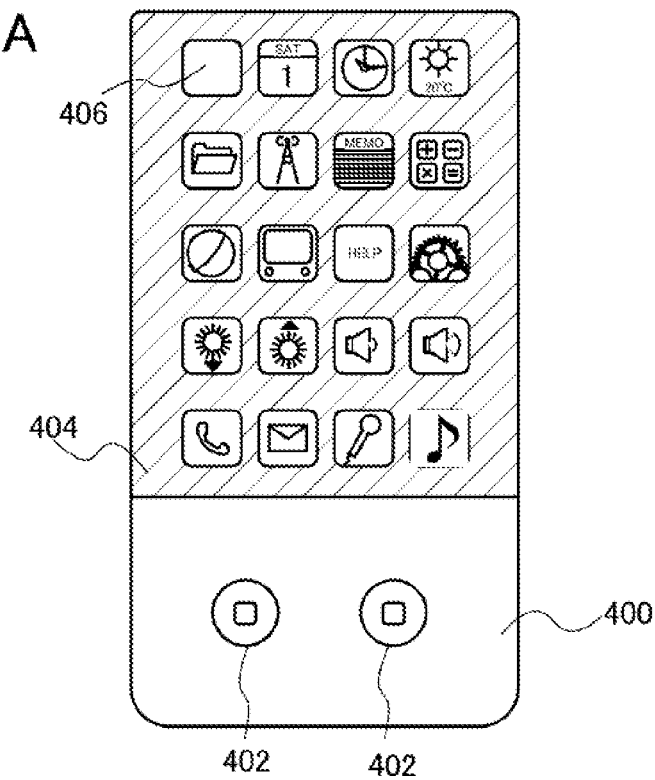
FIGS. 8A and 8B are diagrams illustrating an electronic device of one embodiment of the present invention.
Figure 8B:
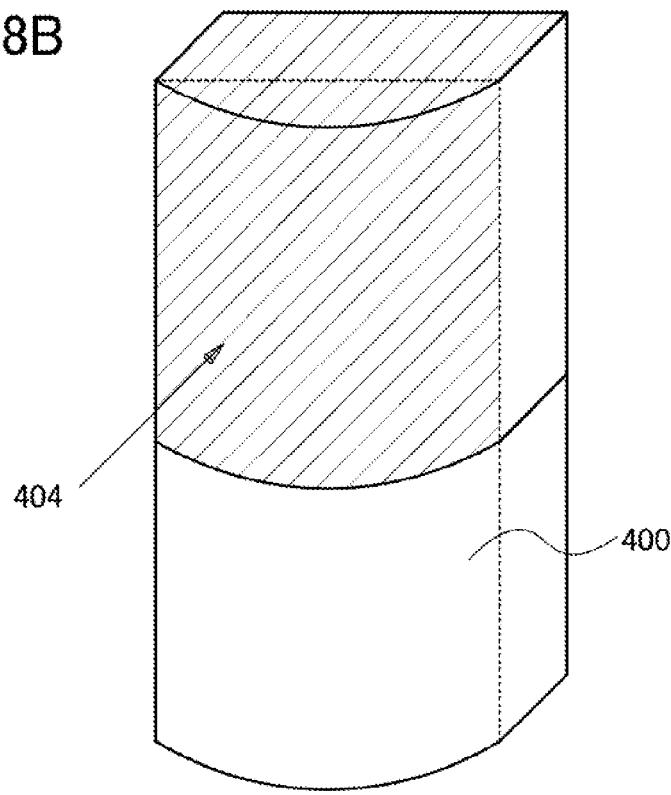

FIG. 8A is a top view of the mobile phone when it is seen from the front, and FIG. 8B is a perspective view of the mobile phone.

The mobile phone shown in FIGS. 8A and 8B has a housing 400, a display portion 404 incorporated into the housing 400, and operation buttons 402.

Further, the light-emitting device described in Embodiment 1 is incorporated into the display portion 404. In this embodiment, a combination of the light-emitting device and a touch panel which is separately formed is a display portion 404. Thus, operation portions 406 are formed over the display portion 404.

In the mobile phone of this embodiment, as shown in FIG. 8B, the display portion 404 is curved with a specific curvature radius. Further, a region in a top portion of the housing 400 is also included in the display portion 404; thus, the display portion 404 of the mobile phone can be seen not only from the front but also from the top portion.

For example, on the top display region, incoming mails or calls, dates, phone numbers, personal names, and the like may be displayed. Accordingly, when the mobile phone is put in a breast pocket or the like, the display region can be seen without taking out the mobile phone from the breast pocket or the like.

The light-emitting device of this invention can be formed over a flexible substrate as described above and thus can be applied to a curved medium. Further, the light-emitting device formed over a flexible substrate is thin and light-weight; thus is preferably applied to a mobile phone and the like.

As described above, this embodiment can provide a highly reliable light-emitting device in which by the provision of the spacer and the fixed portion between pixels, a light-emitting element is prevented from being damaged when external physical force is applied.

Embodiment 5 can be implemented in appropriate combination with the structures described in the other embodiments.

This application is based on Japanese Patent Application serial no. 2011-107414 filed with Japan Patent Office on May 12, 2011, the entire contents of which are hereby incorporated by reference.

What is claimed is:
1. A method for manufacturing a light-emitting device, comprising the steps of:
  forming a first separation layer over a first substrate, a layer including a transistor over the first separation layer, and a pixel electrode connected to the transistor;
  forming a partition covering a periphery of the pixel electrode;
  forming a spacer formed of a light absorbing material over the partition;
  forming a layer including an organic compound over the pixel electrode, the partition, and the spacer;
  forming an electrode having a light-transmitting property over the layer including the organic compound;
  forming a second separation layer over a second substrate and a coloring layer over the second separation layer;
  fixing the first substrate and the second substrate with a bonding layer having the light-transmitting property;
  after separating the second substrate provided with the second separation layer, irradiating the spacer with laser light through the coloring layer so that the layer including the organic compound, the electrode having the light-transmitting property and the bonding layer are melted to form a fixed portion on and in contact with the spacer; and
  separating the first substrate provided with the first separation layer after irradiation with the laser light, wherein the fixed portion is a mixture of the layer including the organic compound, the electrode having the light-transmitting property and the bonding layer.

2. The method for manufacturing a light-emitting device according to claim 1, wherein after the first substrate provided with the first separation layer is separated, a first flexible substrate is further bonded to the layer including the transistor.

3. The method for manufacturing a light-emitting device according to claim 1, wherein after the second substrate provided with the second separation layer is separated, a second flexible substrate is further bonded to the coloring layer.

4. The method for manufacturing a light-emitting device according to claim 1, wherein a beam profile of a laser beam along a cross section perpendicular to an optical axis of the laser light has a top flat shape in a focal position.

5. The method for manufacturing a light-emitting device according to claim 1, wherein the first substrate and the second substrate are glass substrates.

6. The light-emitting device according to claim 1, wherein the coloring layer is a light shielding film.

7. A light-emitting device comprising:
- a layer including a transistor over a first substrate;
- a pixel electrode connected to the transistor;
- a partition covering a periphery of the pixel electrode;
- a spacer on and in contact with the partition;
- a fixed portion in contact with the spacer;
- a layer including an organic compound over the pixel electrode;
- an electrode having a light-transmitting property over the layer including the organic compound;
- a second substrate provided with a coloring layer; and
- a bonding layer maintaining a gap between the first substrate and the second substrate, wherein the fixed portion is in contact with the bonding layer and is provided between the spacer and the coloring layer, and wherein the fixed portion is a mixture of the layer including the organic compound, the electrode having the light-transmitting property and the bonding layer.

8. The light-emitting device according to claim 7, wherein the spacer is a light absorbing material.

9. The light-emitting device according to claim 7, wherein the first substrate and the second substrate are flexible substrates.

10. The light-emitting device according to claim 7, wherein the coloring layer is a light shielding film.

11. A light-emitting device comprising:
- a layer including a transistor over a first substrate;
- a pixel electrode connected to the transistor;
- a partition covering a periphery of the pixel electrode;
- a spacer over the partition;
- a fixed portion in contact with the spacer;
- a layer including an organic compound in contact with the spacer;
- an electrode having a light-transmitting property over the layer including the organic compound;
- a second substrate provided with a light-shielding film; and
- a bonding layer maintaining a gap between the first substrate and the second substrate, wherein the fixed portion is in contact with the bonding layer and is provided between the spacer and the light shielding film, and wherein the fixed portion is a mixture of the layer including the organic compound, the electrode having the light-transmitting property and the bonding layer.

12. The light-emitting device according to claim 11, wherein the first substrate and the second substrate are flexible substrates.

* * * * *

UNITED STATES PATENT AND TRADEMARK OFFICE
CERTIFICATE OF CORRECTION

| | | |
|---|---|---|
| PATENT NO. | : 8,597,965 B2 | Page 1 of 1 |
| APPLICATION NO. | : 13/467166 | |
| DATED | : December 3, 2013 | |
| INVENTOR(S) | : Kaoru Hatano et al. | |

It is certified that error appears in the above-identified patent and that said Letters Patent is hereby corrected as shown below:

In the Specification:

Col. 4, line 25, "the Light-emitting device" should read --the light-emitting device--

Col. 4, line 66, "embodiment (lithe present" should read --embodiment of the present--

Col. 5, line 24, "active matrix Light-emitting" should read --active matrix light-emitting--

Col. 9, line 49, "(SnO, or the like)," should read --(SnO$_2$ or the like)--

Col. 10, line 5, "the First insulating layer 114" should read --the first insulating layer 114--

Col. 11, line 10, "in Which light emitted" should read --in which light emitted--

Col. 11, line 27, "second electrode layer 1.22" should read --second electrode layer 122--

Col. 11, line 32, "(In$_3$O$_3$-ZnO or the like)" should read --(In$_2$O$_3$-ZnO or the like)--

Col. 11, lines 46-47, "a Light-emitting element," should read --a light-emitting element,--

Col. 12, line 25, "the second butler layer" should read --the second buffer layer--

Col. 12, lines 42-43, "A thy agent" should read --A dry agent--

Col. 14, line 66, "As described, above," should read --As described above,--

Col. 17, line 38, "exhibiting red light; a second" should read --exhibiting red light, a second--

In the Claims:

Col. 20, line 30, "the electrode haying the" should read --the electrode having the--

Signed and Sealed this
Eighteenth Day of March, 2014

Michelle K. Lee
*Deputy Director of the United States Patent and Trademark Office*